(12) United States Patent
Shih

(10) Patent No.: US 8,674,463 B2
(45) Date of Patent: Mar. 18, 2014

(54) MULTIFUNCTION MEMS ELEMENT AND INTEGRATED METHOD FOR MAKING MOS AND MULTIFUNCTION MEMS

(75) Inventor: Hui-Shen Shih, Chang-Hua Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 337 days.

(21) Appl. No.: 12/430,105

(22) Filed: Apr. 26, 2009

(65) Prior Publication Data

US 2010/0270628 A1    Oct. 28, 2010

(51) Int. Cl.
*H01L 29/84* (2006.01)
*H01L 21/02* (2006.01)

(52) U.S. Cl.
USPC ........... 257/415; 257/419; 257/528; 257/532; 257/690; 257/E21.003; 257/E29.324

(58) Field of Classification Search
USPC .............. 257/415, E29.324, E21.003
See application file for complete search history.

(56) References Cited

U.S. PATENT DOCUMENTS

| | | | |
|---|---|---|---|
| 6,872,902 B2 | 3/2005 | Cohn | |
| 7,498,918 B2 | 3/2009 | Hsu | |
| 7,851,975 B2 | 12/2010 | Lan | |
| 2002/0153236 A1* | 10/2002 | Song et al. | 200/181 |
| 2005/0014317 A1 | 1/2005 | Pyo | |
| 2005/0162806 A1 | 7/2005 | Sarkar | |
| 2005/0221529 A1 | 10/2005 | Bang | |
| 2009/0134492 A1* | 5/2009 | Morris et al. | 257/532 |
| 2011/0121415 A1* | 5/2011 | Quevy et al. | 257/417 |

* cited by examiner

*Primary Examiner* — Minh-Loan T Tran
*Assistant Examiner* — Fazli Erdem
(74) *Attorney, Agent, or Firm* — Winston Hsu; Scott Margo

(57) ABSTRACT

A multifunction MEMS element includes a first cantilever, a second cantilever and a MEMS component. The first cantilever, the second cantilever and the MEMS component together form a MEMS structure. The MEMS component includes an inductor device.

14 Claims, 8 Drawing Sheets

MULTIFUNCTION MEMS ELEMENT AND INTEGRATED METHOD FOR MAKING MOS AND MULTIFUNCTION MEMS

BACKGROUND OF THE INVENTION

1. Field of the Invention

The present invention relates to a multifunction MEMS element and a method to make the multifunction MEMS element. In particular, the present invention relates to a multifunction MEMS element and a method to integrate a MOS and a multifunction MEMS element.

2. Description of the Prior Art

A micro electro mechanical system (MEMS) is a tiny device with both the electronic and mechanical functions. Apart from the conventional electro and mechanical processing, the micro electro mechanical system installs some micro structures, such as a circuit, a sensor, an actuator, a cantilever, a beam, a membrane, a channel, a cavity, a joint, a hinge, a link, a crank, a gear or a rack on a Si wafer by miniaturization techniques and is operated based on, for example, electromagnetic, electrostrictive, thermoelectric, piezoelectric, or piezoresistive effects. The manufacture method of the micro electro mechanical system therefore requires various processing techniques.

The current methods to manufacture the micro electro mechanical system are, for example, the silicon-based method, the LIGA method and the polymer method. Considering the cost for the mass production, the well-developed semiconductor process, such as lithography, vapor deposition and etching is much favored to manufacture the micro electro mechanical system on the isolation layer or other substrates due to its potential capability.

On the other hand, an inductor is a passive electronic component that stores energy in the form of a magnetic field, and an inductor tends to resist any change in the amount of current flowing through it. The inductor is usually used with capacitors in various wireless communications applications for providing stable currents, switched phases, filtering and resonance. In its simplest form, the inductor consists of a wire loop or coil. The inductance is directly proportional to the number of turns, the thickness, the length, and the radius of the coil. The inductance also depends on the type of material around which the coil is wound. In a semiconductor manufacturing process, at least two metal layers with specifically designed layout patterns and a plurality of via plugs for connecting these two metal layers are used to form a wire loop, thus fabricating an inductor onto an integrated circuit chip. Recently, for obtaining an inductor with a smaller size, a three-dimensional inductor is produced to have an increased coil density. However, in order to form the inductor, much space on the substrate is occupied.

Because both the micro electro mechanical system and the MOS element may be manufactured by the techniques which are integrated with the current semiconductor technology, the manufacturing process which integrates the micro electro mechanical system and the MOS element becomes a hot issue. In order to form each part of the micro electro mechanical system, the metal interconnection process is employed to construct the components of the micro electro mechanical system. When the micro electro mechanical system has more and more parts, the method is getting more and more complicated and more and more space is needed to accommodate them.

Therefore, a novel method to integrate the micro electro mechanical system and the MOS element is needed. In one aspect, a single micro electro mechanical element may have multiple functions to save the space on the chip. In another aspect, two different methods to make the micro electro mechanical system and the MOS element are integrated to simplify the integration of the semiconductor process, lower the cost for manufacture and render the products to be much favorable.

SUMMARY OF THE INVENTION

Accordingly, the present invention proposes a multifunction MEMS element and a method to integrate a multifunction MEMS element and a MOS. In one aspect, a single micro electro mechanical element may have various functions. In another aspect, two different methods are integrated to simplify the integration of the semiconductor process, lower the cost for manufacture and render the products to be much favorable.

The present invention first proposes a multifunction MEMS element. The multifunction MEMS element includes a first cantilever, a second cantilever and a MEMS component. The first cantilever, the second cantilever and the MEMS component together form a MEMS structure. The MEMS component includes an inductor device so that the multifunction MEMS element of the present invention may simultaneously have a pre-determined MEMS function and an inductor function.

The present invention again proposes a method to integrate a multifunction MEMS element and a MOS. First, a substrate with a MEMS region and a MOS region is provided. Second, a metal interconnection process is performed to form a metal interconnection in the MOS region and a multifunction MEMS element in the MEMS region so that both the metal interconnection and the multifunction MEMS element are covered by an insulating material. The multifunction MEMS element includes an inductor device. Then, an etching process is performed on the insulating material in the MEMS region to expose the multifunction MEMS element.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
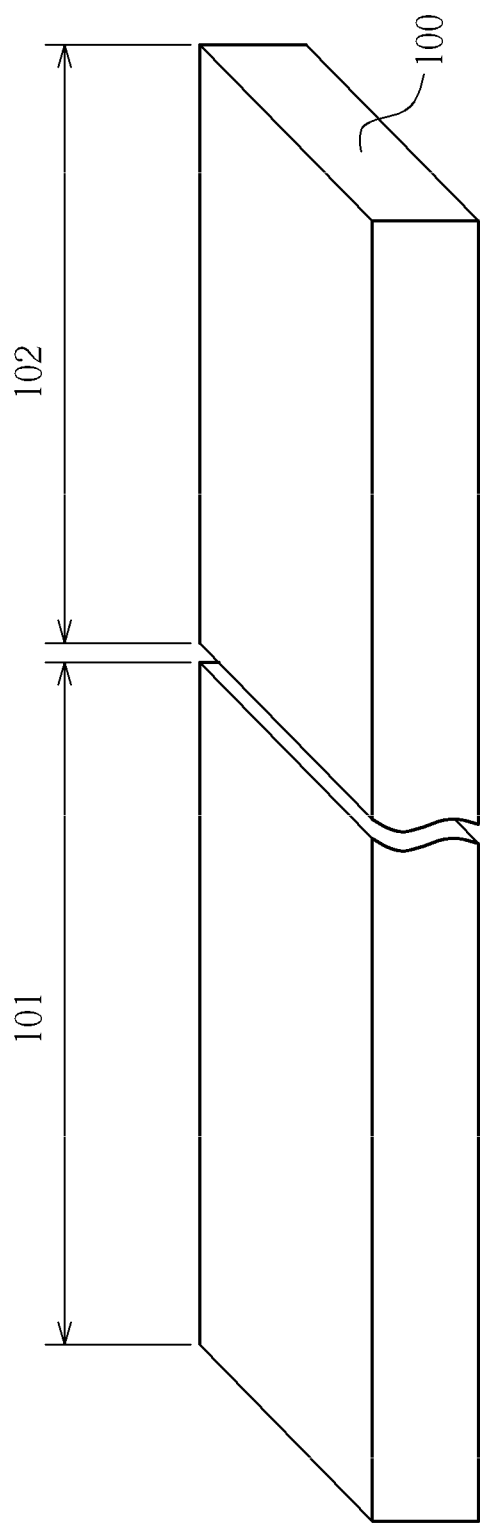
FIGS. 1-4 illustrate an example of the method to integrate a multifunction MEMS element and a metal-oxide-semiconductor.

The present invention first provides a method to integrate a multifunction MEMS element and a metal-oxide-semiconductor (MOS). FIGS. 1-4 illustrate an example of the method to integrate a multifunction MEMS element and a metal-oxide-semiconductor. First, as shown in FIG. 1, a substrate 100 is provided. The substrate 100 is usually a semi-conductive material, such as Si. The substrate 100 may include a MEMS region 101 and a MOS region 102.

In addition, the substrate 100 may include other regions or structures, such as, a logic region (not shown) or a seal ring region (not shown). The logic region is used to construct the needed logic elements, such as MOS. The seal ring region may surround the MEMS region 101 to form the pre-determined seal ring, i.e. a protective structure, to protect the pre-determined MEMS. The substrate 100 may also include various doping regions, transistors, resistances, or other material layers, such as a contact etch stop layer, (CESL) (not shown) or ILD (not shown).

Figure 2:
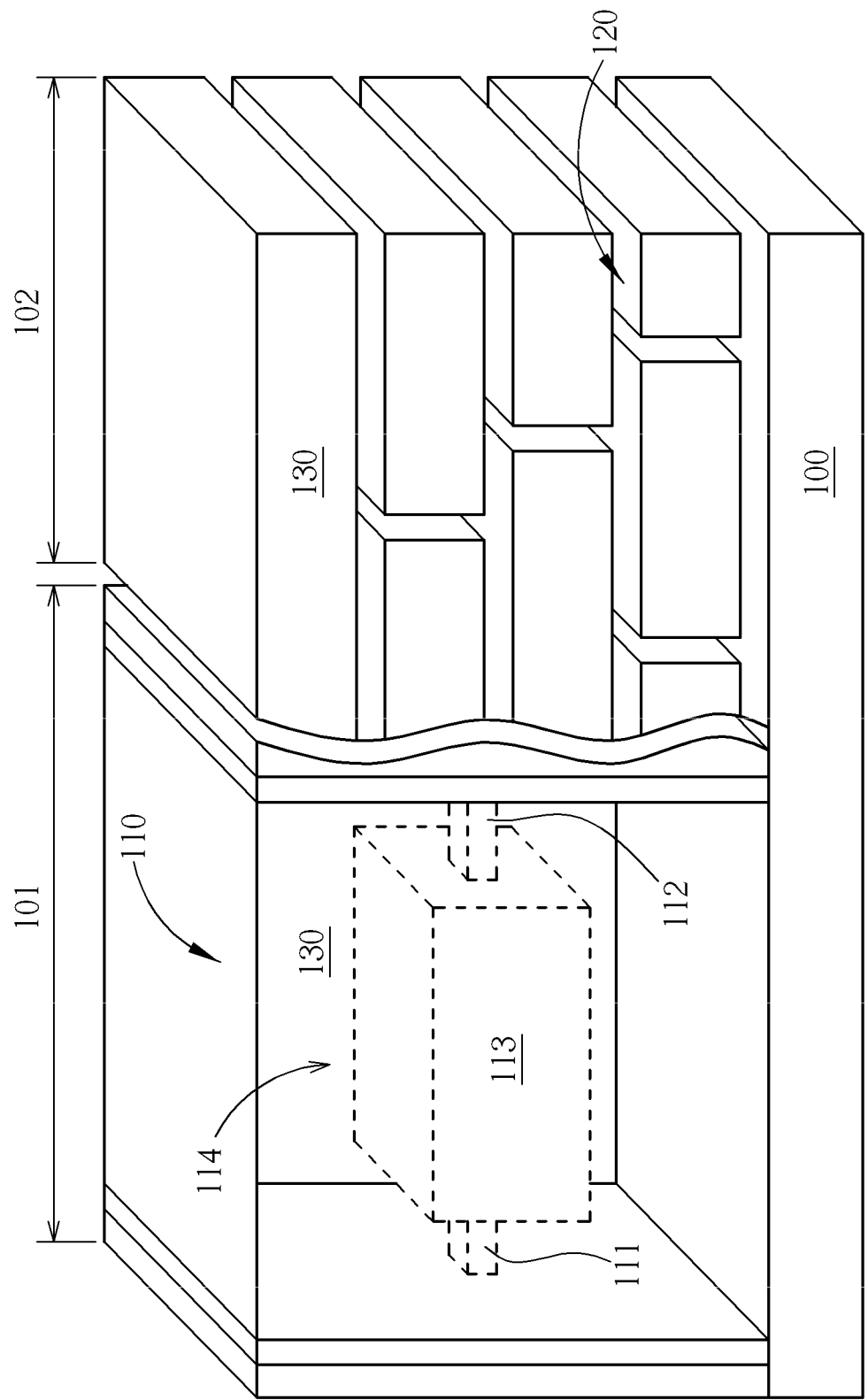

Second, as shown in FIG. 2, a metal interconnection process is performed to respectively form a pre-determined structure in the MOS region 101 and in the MEMS region 102. For example, the metal interconnection process forms a multifunction MEMS element 110 in the MEMS region 101. On the other hand, the metal interconnection process forms a metal interconnection 120 in the MOS region 102. The multifunction MEMS element 110 of the present invention is pre-determined to have two or more functions, so it is called a "multifunction MEMS element 110."

The multifunction MEMS element 110 may have various parts. For example, a first cantilever 111, a second cantilever 112 and a MEMS component 113 to form various MEMS elements, such as an accelerometer, an actuator, a gyroscope, a mini microphone, a sensor and a micro spring.

On one aspect, the first cantilever 111 and the second cantilever 112 together support the MEMS component 113 to altogether form a MEMS structure 114. On another aspect, the first cantilever 111 and the second cantilever 112 maybe made of a conductive material or of a resilient material in accordance with the pre-determined function of the multifunction MEMS element 110.

Figure 3A:
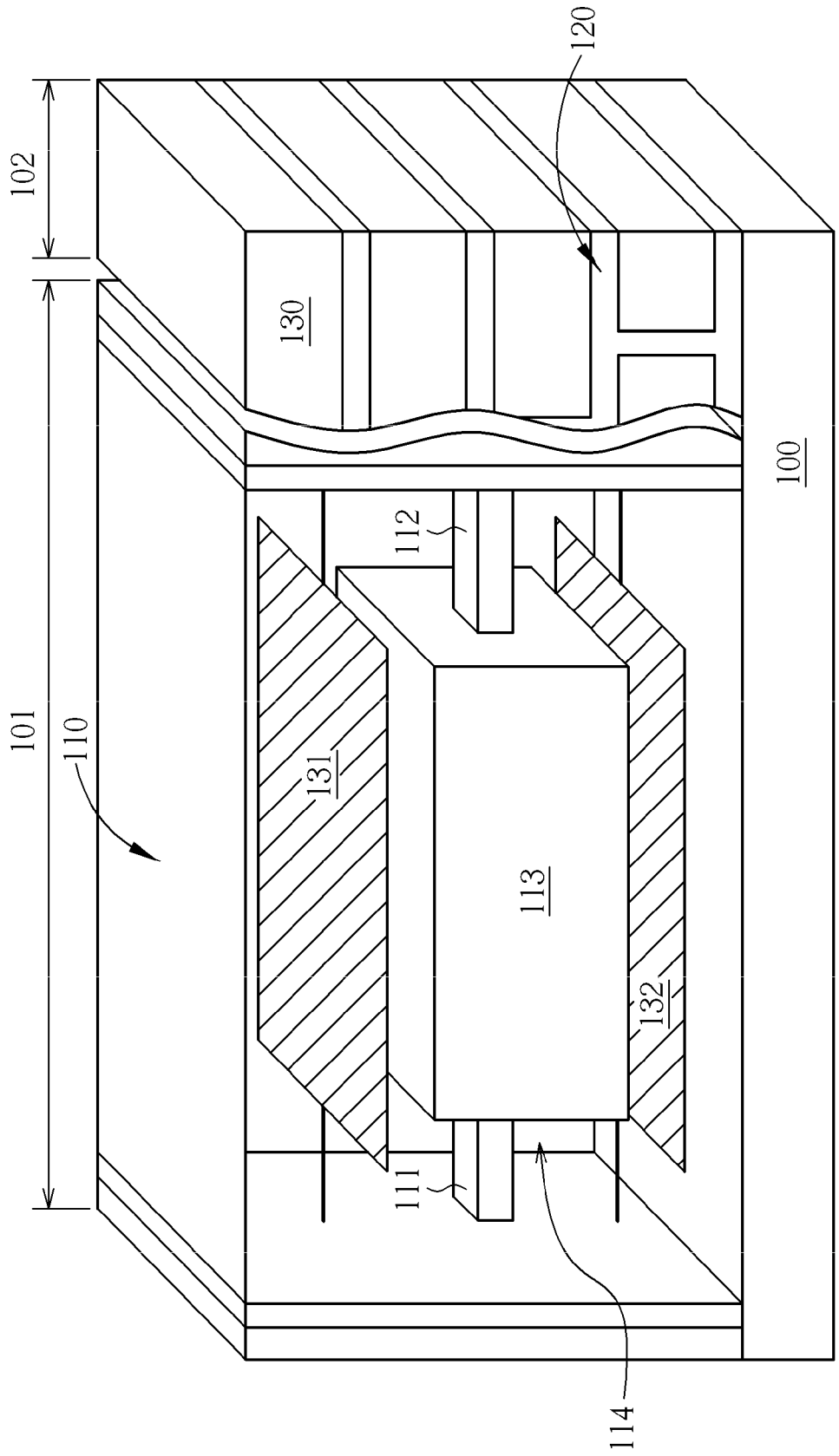

For example, in a first embodiment of the present invention, as shown in FIG. 3A, if the multifunction MEMS element 110 is an accelerometer, the MEMS component 113 is a mass body to measure the acceleration. In such a case, the first cantilever 111 and the second cantilever 112 are made of a resilient material to measure the acceleration of the mass body. In the meantime, the MEMS component 113 may include a metal and/or a silicon compound such silicon oxide or silicon nitride.

Figure 3B:
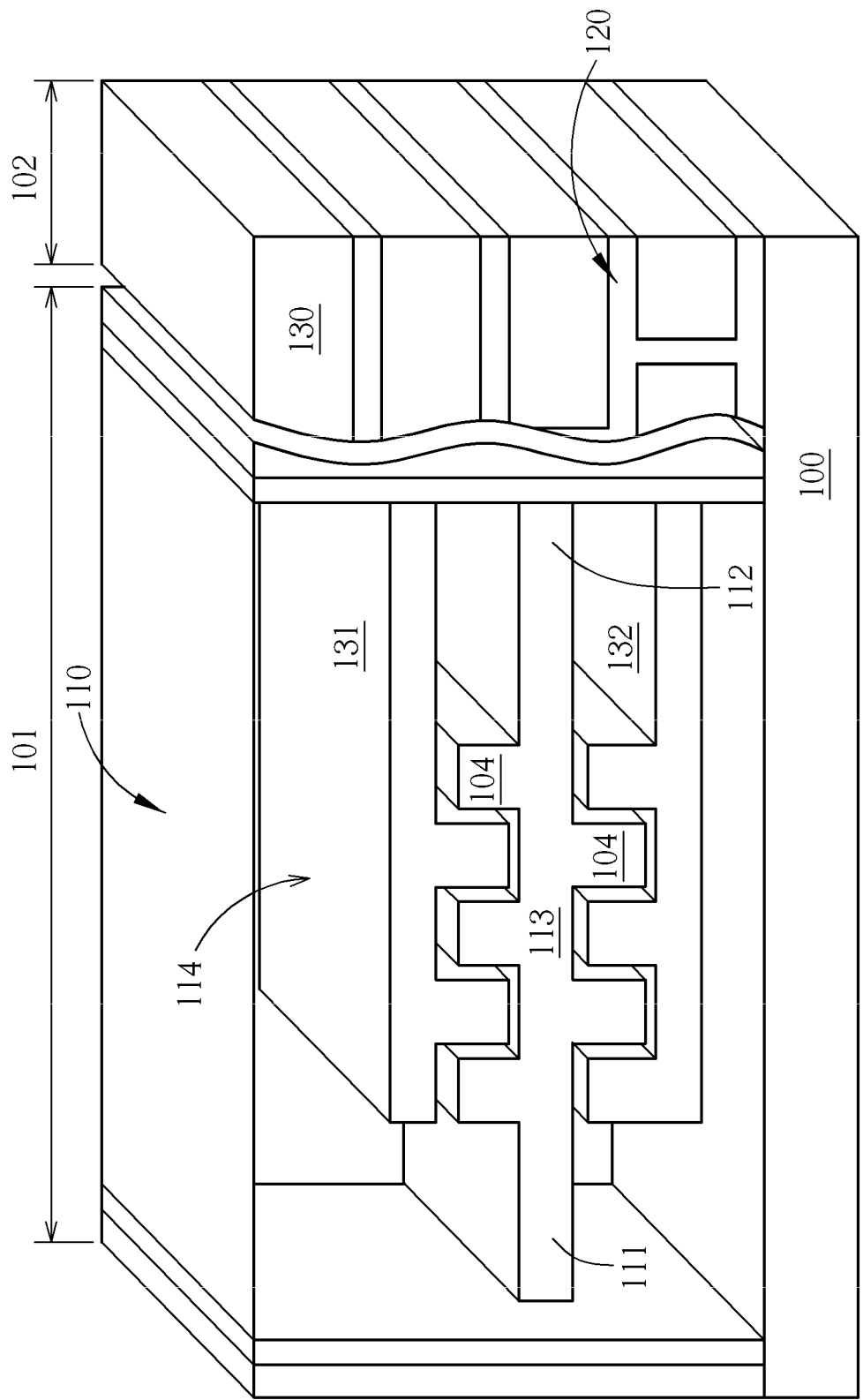

For example, in a second embodiment of the present invention, as shown in FIG. 3B, if the multifunction MEMS element 110 is a capacitor accelerometer, the MEMS structure 114 is a capacitor structure. The first cantilever 111 and the second cantilever 112 together suspend the MEMS component 113 as the capacitor dielectric. The MEMS component 113 may include a metal and/or a silicon compound and is disposed between the upper electrode 131 and the lower electrode 132 to detect the acceleration by the change of the capacity.

Figure 3C:
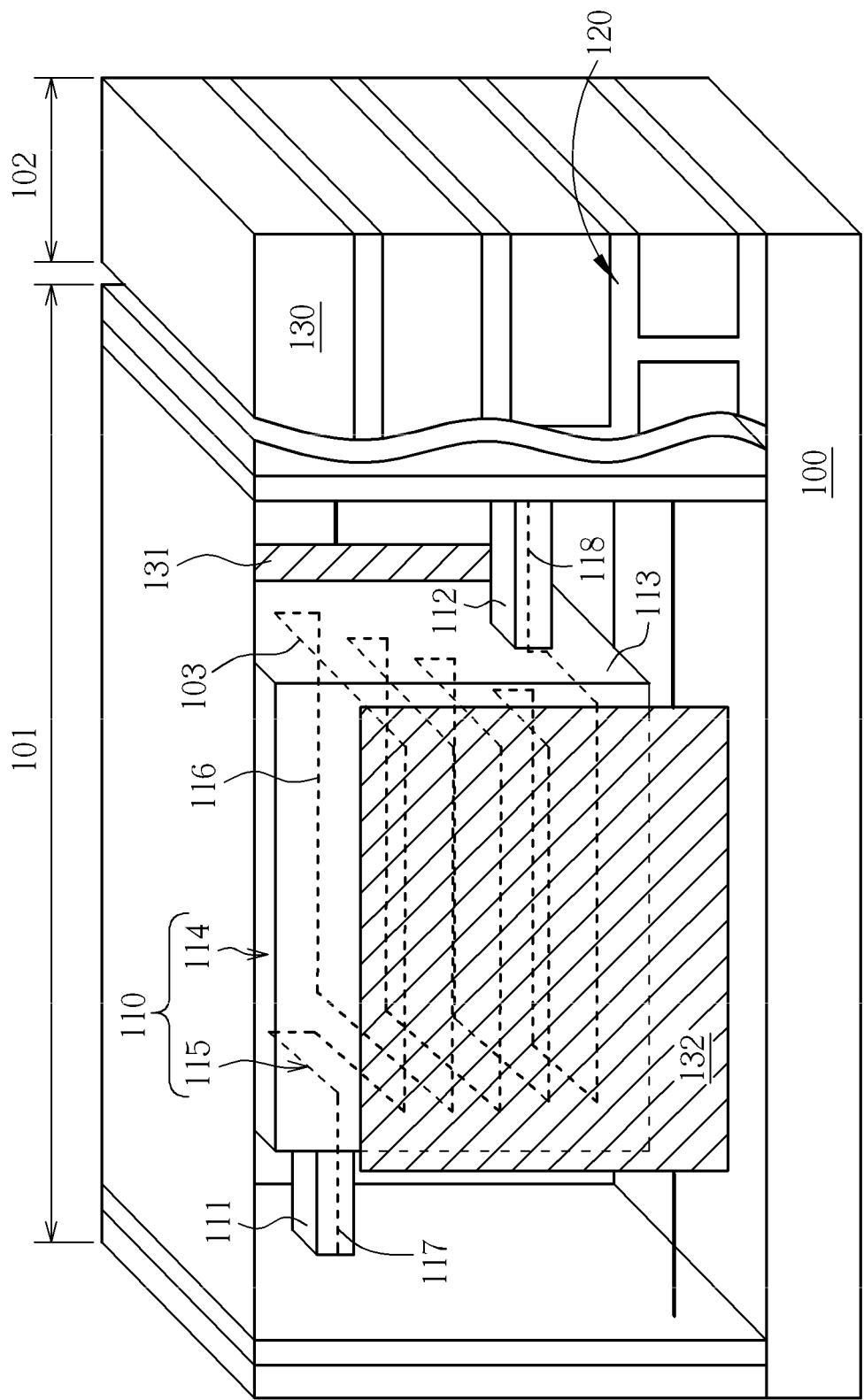

For example, in a third embodiment of the present invention, as shown in FIG. 3C, if the multifunction MEMS element 110 is a mini microphone, the first cantilever 111 and the second cantilever 112 are the electrodes of the mini microphone to form a current circuit.

Please note that, the present invention uses a metal interconnection process to simultaneously form a multifunction MEMS element 110 in the MEMS region 101 and a metal interconnection 120 in the MOS region 102 when each metal-insulator layer (MIM) and each metal interconnection pattern layer are formed and a wire 116 is formed in the MEMS component 113 to become an inductor device 115. Such inductor device 115 is externally connected to the first cantilever 111 as the first electric connection 117 and to the second cantilever 112 as the second electric connection 118. When the electric current passes through the first electric connection 117 and the second electric connection 118, the wire 116 serves as an inductor.

Figure 4A:
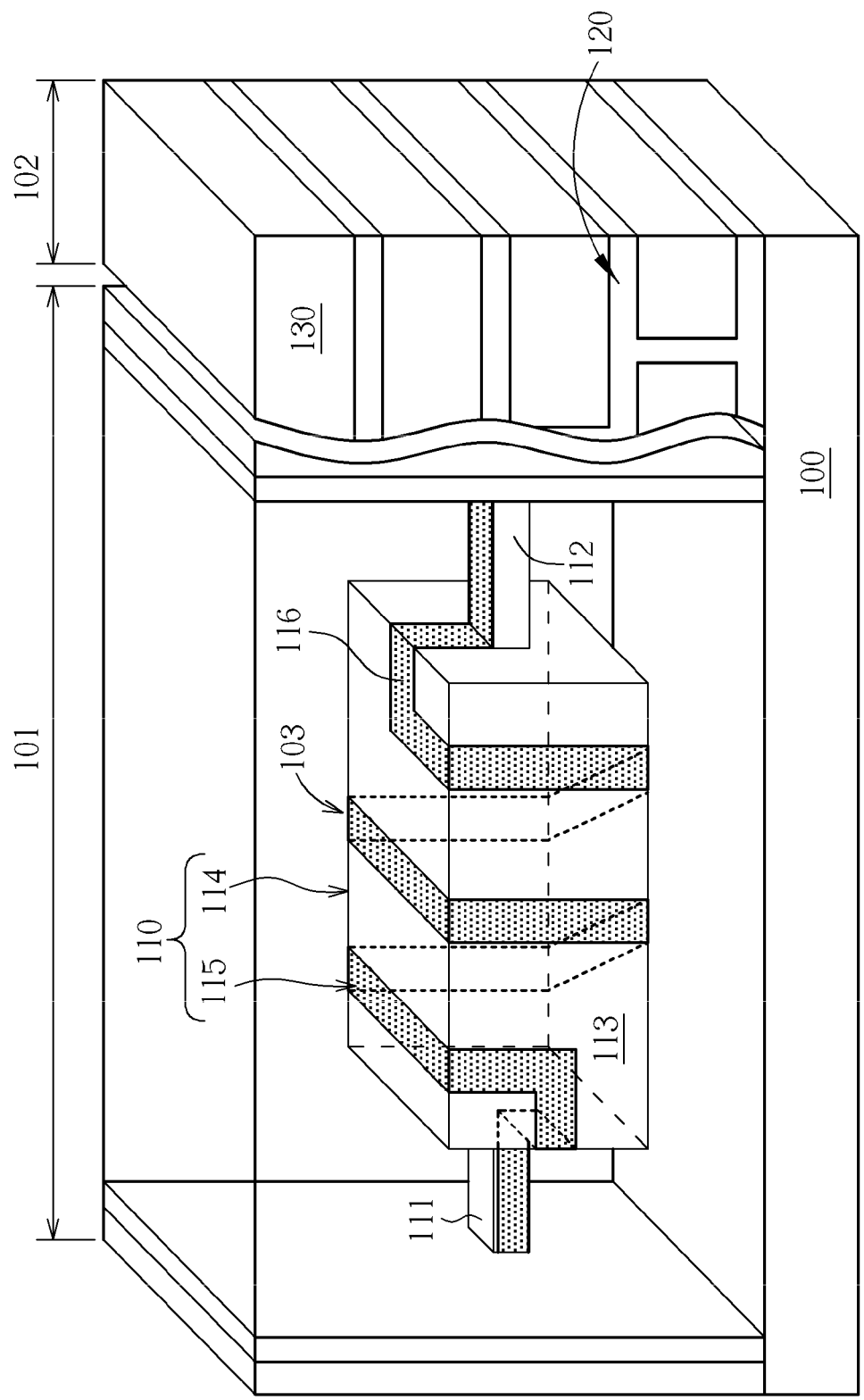
Figure 4B:
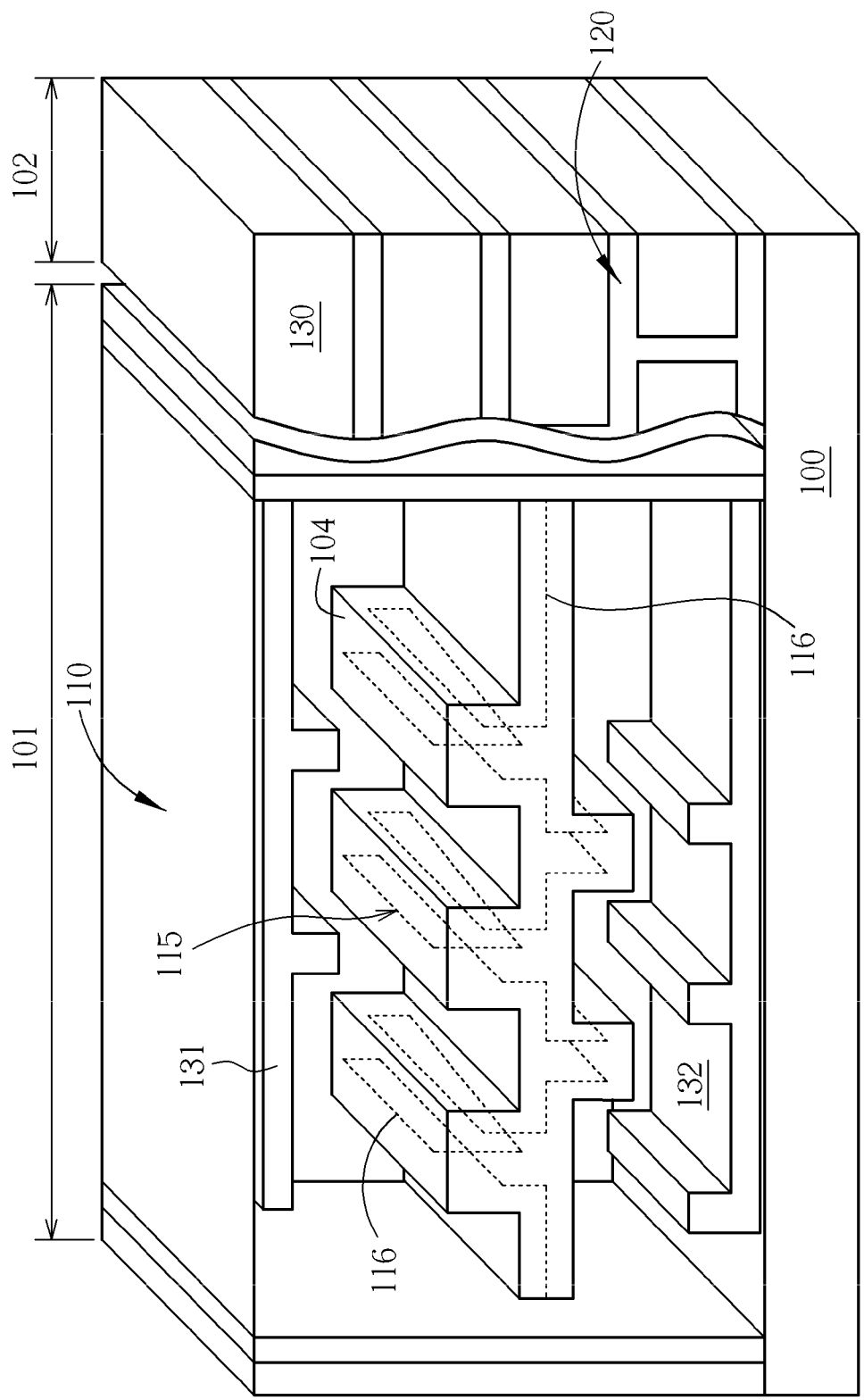

The wire 116 in the MEMS component 113 may have various shapes, for example planar or 3-dimentional. If the MEMS component 113 is planar, as shown in FIG. 4B, it may be in a shape of a fishbone. The wire 116 is in the extending fins 104 from the fishbone and disposed between the upper electrode 131 and the lower electrode 132 of the capacitor. The wire 116 forms the required coils in the fins. If the MEMS component 113 is 3-dimentional, as shown in FIG. 4A, there may be multiple coils 118. Optionally, the inductor device 115 is integrated with the metal interconnection 120 to have multiple metal pattern layers when the metal interconnection process forms multiple layers of metal interconnection 120.

In order to avoid the current circuit of the MEMS structure 114 cross talking with that of the inductor device 115, the first cantilever 111 and the second cantilever 112 are independent of the first electric connection 117 and the second electric connection 118. Preferably, the MEMS component 113 further includes an insulating structure to cover the inductor device 115.

Besides, as shown in FIG. 2, when the metal interconnection process is completed, the metal interconnection 120 and the multifunction MEMS element 110 are covered by an insulating material 130 constituting of the MIM. Methods to perform the metal interconnection process and to form the insulating material 130 are well known by persons of ordinary skills in the art and the details will not be discussed here.

Then, an etching process is performed on the insulating material 130 in the MEMS region 101 to expose the multifunction MEMS element 110, as shown in FIG. 2, preferably, to fully expose the multifunction MEMS element 110. The exposed multifunction MEMS element 110 may freely move to perform the pre-determined functions.

The etching process may be optional dry etching and/or wet etching, preferably in alternate order. The dry etching method may quickly remove the insulating material 130. The wet etching method may break through the hindrance of the multifunction MEMS element 110.

Figure 5:
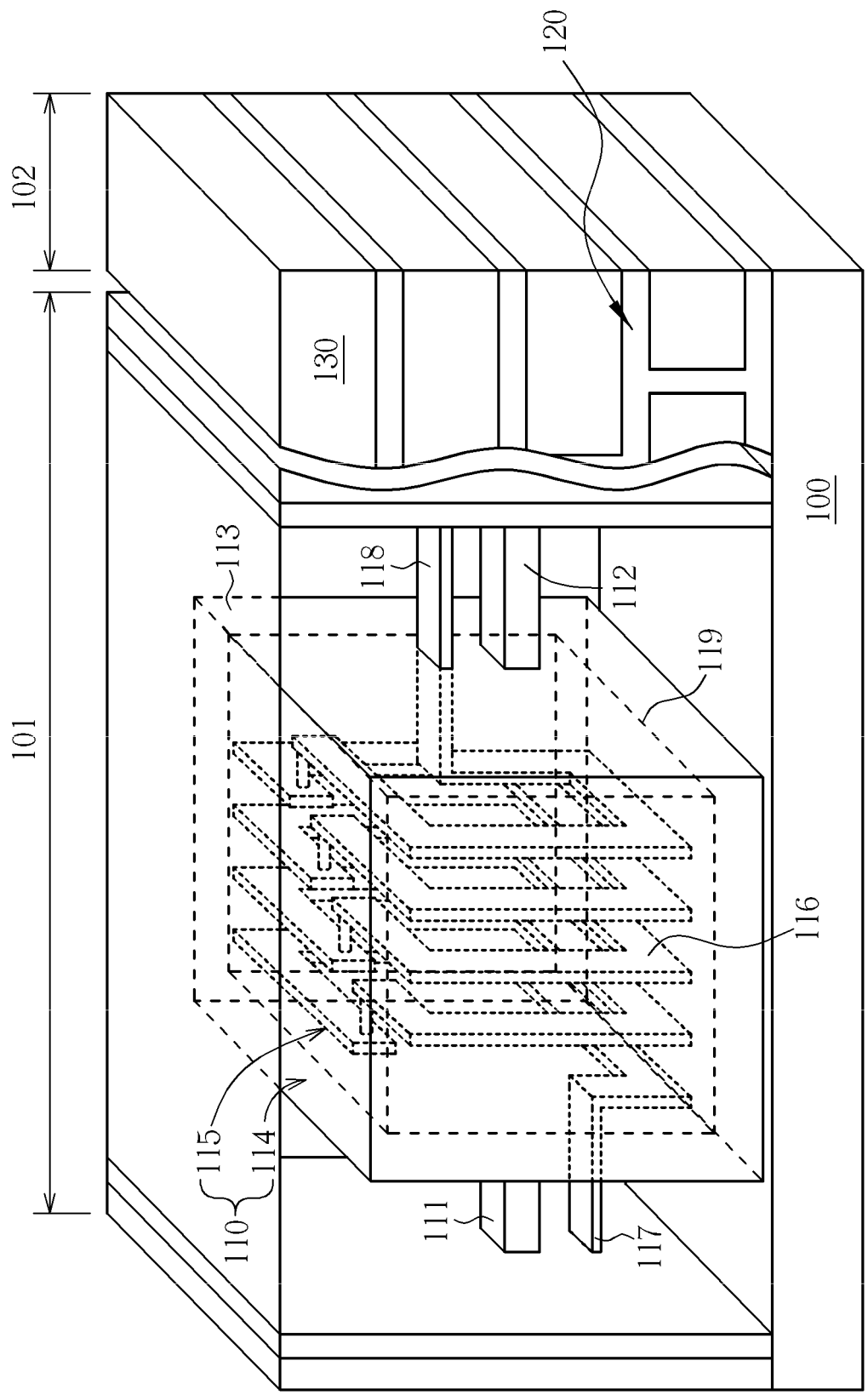
FIG. 5 illustrates a preferred example of the multifunction MEMS element of the present invention.

Given the above, the present invention obtains a multifunction MEMS element 110. FIG. 5 illustrates a preferred example of the multifunction MEMS element of the present invention. The multifunction MEMS element 110 of the present invention includes a first cantilever 111, a second cantilever 112, and a MEMS component 113. The first cantilever 111 and the second cantilever 112 together support the MEMS component 113 to altogether form a MEMS structure 114. The MEMS component 113 may be an accelerometer, an actuator, a gyroscope, a mini microphone, a sensor or a micro spring.

The first cantilever 111 and the second cantilever 112 may be made of a conductive material or a resilient material in accordance with the pre-determined function of the MEMS component 113.

For example, if the multifunction MEMS element 110 is an accelerometer, the MEMS component 113 is a mass body to measure the acceleration. In such a case, the first cantilever 111 and the second cantilever 112 are made of a resilient material to measure the acceleration of the mass body. At the meantime, the MEMS component 113 may include a metal or a silicon compound such as silicon oxide or silicon nitride. If the multifunction MEMS element 110 is a capacitor accelerometer, the MEMS structure 114 is a capacitor structure. The first cantilever 111 and the second cantilever 112 together suspend the MEMS component 113 as the capacitor dielectric. The MEMS component 113 may include a metal and/or a silicon compound and is disposed between the upper electrode 131 and the lower electrode 132 to detect the acceleration by the change of the capacity. If the multifunction MEMS element 110 is a mini microphone, the first cantilever 111 and the second cantilever 112 are the electrodes of the mini microphone to form a current circuit.

The MEMS component 113 further includes an inductor device 115. Such inductor device 115 is composed of the wire 116, the first cantilever 111 as the first electric connection 117 and the second cantilever 112 as the second electric connection 118. When the electric current passes through the first electric connection 117 and the second electric connection 118, the wire 116 serves as an inductor.

The wire 116 to form the inductor device 115 in the MEMS component 113 may have various shapes, for example planar or 3-dimentional and be disposed on the surface or inside the MEMS component 113. If the MEMS component 113 is planar, as shown in FIG. 3B/4B, it may be in a shape of a fishbone. The wire 116 is in the extending fins 104 from the fishbone and disposed between the upper electrode 131 and the lower electrode 132 of the capacitor. The wire 116 forms the required coils in the fins. If the MEMS component 113 is 3-dimentional, as shown in FIG. 3C, there may be multiple coils 118.

In addition, in order to avoid the current circuit of the MEMS structure 114 cross talking with that of the inductor device 115, the first cantilever 111 and the second cantilever 112 are independent of the first electric connection 117 and the second electric connection 118, preferably electrically independent. For example, the MEMS component 113 further includes an insulating structure 119 to cover the wire 116 so that the MEMS structure 114 and the inductor device 115 may independently function.

Those skilled in the art will readily observe that numerous modifications and alterations of the device and method may be made while retaining the teachings of the invention.

What is claimed is:

1. A multifunction MEMS element, comprising:
    a first cantilever;
    a second cantilever; and
    a MEMS component forming a MEMS structure together with said first cantilever and said second cantilever, wherein said MEMS component comprises an inductor device, said MEMS component including the inductor device is entirely freely moving upon actuating, and said first cantilever electrically connects to said inductor device and said second cantilever electrically connects to said inductor device.

2. The multifunction MEMS element of claim 1, wherein said MEMS component further comprises a MEMS device selected from a group consisting of accelerometer, actuator, gyroscope, mini microphone, sensor and micro spring.

3. The multifunction MEMS element of claim 1, wherein said MEMS structure is a capacitor structure.

4. The multifunction MEMS element of claim 3, wherein said capacitor structure is in a shape of a fishbone.

5. The multifunction MEMS element of claim 1, wherein said MEMS structure is a capacitor accelerometer.

6. The multifunction MEMS element of claim 1, wherein said MEMS component comprises a silicon compound.

7. The multifunction MEMS element of claim 1, wherein said inductor device comprises a first electric connection and a second electric connection.

8. The multifunction MEMS element of claim 7, wherein said first cantilever and said second cantilever are independent of said first electric connection and said second electric connection.

9. The multifunction MEMS element of claim 1, wherein said inductor device is planar.

10. The multifunction MEMS element of claim 1, wherein said inductor device is 3-dimensional.

11. The multifunction MEMS element of claim 1, wherein said first cantilever and said second cantilever together support said MEMS component.

12. The multifunction MEMS element of claim 1, wherein said MEMS component is disposed between said first cantilever and said second cantilever.

13. The multifunction MEMS element of claim 1, wherein said first cantilever and said second cantilever together suspend the MEMS component, and said first cantilever and said second cantilever are disposed at opposite sides of said MEMS component.

14. The multifunction MEMS element of claim 2, wherein said MEMS device is different from said inductor device.

* * * * *